United States Patent [19]

Wardell et al.

[11] E Patent Number: Re. 33,275

[45] Reissued Date of Patent: Jul. 24, 1990

[54] ELECTRON SPECTROMETER

[75] Inventors: Ian R. M. Wardell, Heathfield; Peter A. Coxon, Buxted, both of United Kingdom

[73] Assignee: VG Instruments Group, Limited, Crawley, United Kingdom

[21] Appl. No.: 409,440

[22] Filed: Sep. 18, 1989

Related U.S. Patent Documents

Reissue of:

[64] Patent No.: 4,758,723
Issued: Jul. 19, 1988
Appl. No.: 50,403
Filed: May 18, 1987

[30] Foreign Application Priority Data

May 19, 1986 [GB] United Kingdom ..... 8612099

[51] Int. Cl.[5] ..... H01J 49/44
[52] U.S. Cl. ..... 250/305; 250/307
[58] Field of Search ..... 250/305, 307, 310, 311, 250/397

[56] References Cited

U.S. PATENT DOCUMENTS 3,733,483 5/1973 Gren et al. ..... 250/305
3,937,957 2/1976 Schillalies et al. ..... 250/305
4,358,680 11/1982 Read ..... 250/305

FOREIGN PATENT DOCUMENTS 0711922 9/1985 U.S.S.R. ..... 250/305

OTHER PUBLICATIONS

"Field Emission Deflection Energy Analyzer", Kayatt et al., Rev. of Sci. Inst., vol. 43, No. 1, Jan. 1972, pp. 108–111, 250–305.

Turner D. W. et al., Journal of Microscopy, 1984, vol. 136, No. 2, pp. 259–277.

Hovland C. T., Third International Conference on Solid Surfaces, Vienna, 1973, pp. 2363–2366.

Gurker N. et al., Surface & Interface Analysis, 1983, vol. 5(1), pp. 13–19.

Watanabe H. and Uyeda R., J. Phys. Soc. Japan, 1962, vol. 17, pp. 569 to 570.

(List continued on next page.)

*Primary Examiner*—Bruce C. Anderson
*Attorney, Agent, or Firm*—Foley & Lardner, Schwartz, Jeffery, Schwaab, Mack, Blumenthal & Evans

[57] ABSTRACT

There is provided an electron spectrometer operable to produce an image of an electron emitting surface, said spectrometer comprising in sequence:

(a) means for causing electrons to be emitted from said surface;

(b) a first electrostatic lens system arranged to project at least some of said electrons onto a first diffraction plane as a Fourier transform of an electron image of at least a part of said surface;

(c) a torroidal capacitor type electrostatic energy analyzer having an object plane and conjugate thereto a first image plane, said analyzer being disposed with said object plane coincident with said first diffraction plane and being arranged to project electrons of said Fourier transform as an energy dispersed Fourier transform in said first image plane;

(d) energy selection means for transmitting electrons of said energy dispersed Fourier transform having energies only within a selected range; and (e) a second electrostatic lens system arranged to receive electrons transmitted by said energy selection means and therewith to project an electron image of at least a part of said surface onto a second image plane. By projecting a Fourier transform onto the object plane of the energy analyzer it is possible using the spectrometer of the invention to detect in the image plane of the analyzer an energy spectrum uncorrupted by spatial detail and, selecting electrons having energies only within a selected range from the energy dispersed Fourier transform at the image plane of the energy analyzer, it is possible to project onto the second image plane an image of the surface deriving from electron emitted from the surface with energies within a corresponding range.

17 Claims, 3 Drawing Sheets

OTHER PUBLICATIONS

Cundy S. L. et al., J. Sci. Instrum., 1966, vol. 43, pp. 712–715.

Wittry D. B., Brit. J. App. Phys., 1969, vol. 2, pp. 1757–1766.

Crewe A. V. et al., Rev. Sci. Instrum., 1971, vol. 42(4), pp. 411–420.

Andrew J. W. et al., Proc. 9th Int. Congress on Electron Microscopy, Toronto, 1978, vol. 1, pp. 40–41.

Egerton R. F. et al., J. Phys. E., 1975, vol. 8, pp. 1033–1037.

Castaing R. and Henry L., J. Microscopie, 1964, vol. 3(2), pp. 133–152.

Mollenstedt G. and Rang O., Z. Angew. Physik., 1951, vol. 3(5), pp. 187 to 189.

Cazaux J., Ultramicroscopy, 1984, vol. 12, pp. 321–332.

Lampton M. and Malina, R. F., Review of Scientific Instruments, 1976, vol. 47(11), pp. 1360–1362.

Brundle C. R. et al., J. Electron Spectroscopy & Related Phenomena, 1974, vol. 3, pp. 241–261.

Beamson G. et al., Nature, 1981, vol. 290, pp. 556–561.

Plummer et al., J. Molecular Structure, 1982, vol. 79, pp. 145–162.

Dixon A. J., Scanning Electron Microscopy, 1984, vol. 1, pp. 55–66.

Polack F. and Lowenthal S., Journal de Physique, 1984, vol. 45, pp. C2–73 to C2–76.

Ottensmeyer F. P., Electron Optical Systems, 1984, pp. 245–251.

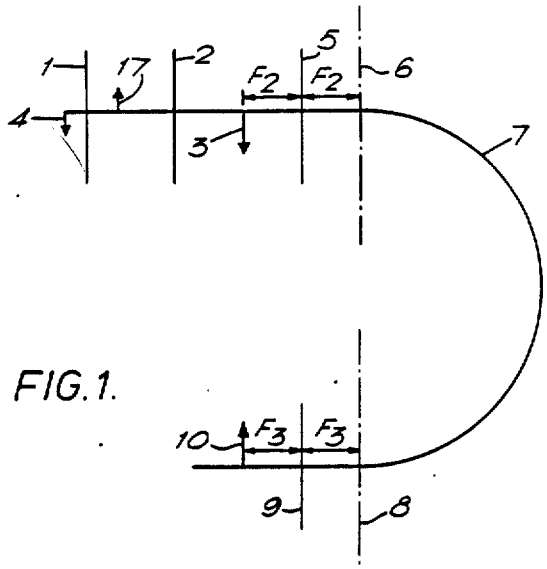
FIG. 1.
FIG. 2.
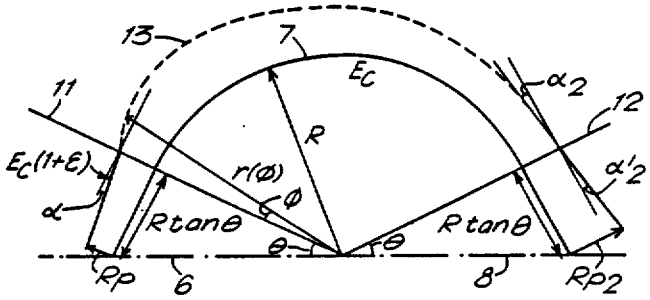

ELECTRON SPECTROMETER

Matter enclosed in heavy brackets [ ] appears in the original patent but forms no part of this reissue specification; matter printed in italics indicates the additions made by reissue.

This invention relates to an electron energy spectrometer having an energy analyzer of the torroidal capacitor type and which is adapted for analyzing electrons emitted from the surface of a sample on bombardment by a beam of primary radiation such as X-rays, UV light or electrons.

Such spectrometers are used for the investigation of sample surfaces because the energy of the emitted electrons is characteristic of the chemical nature of the bombarded surface. Consequently it is useful to obtain information concerning the distribution of a particular chemical species on the surface. A variety of methods of producing an image of the surface utilizing electrons having only a particular range of energies are known. These include a projection method, described by D. W. Turner, I. R. Plummer and H. Q. Porter in Journal of Microscopy, 1984, vol.136 (2) pp 259–277, in which secondary electrons travel along trajectories determined by a powerful divergent magnetic field. The electrons also pass through a retarding potential energy analyzer so that images of the surface comprising only electrons of certain energies can be produced. An instrument of this type does not involve any electrostatic lenses and requires a very large and expensive magnet. It is quite different from the spectrometers conventionally used for surface analysis with which the present invention is concerned.

Another approach, described by C. T. Hovland at the Third International Conference on Solid Surfaces, Vienna, 1977 (pp 2363) is to recreate an image of the surface point by point by scanning a narrow beam of primary radiation across the sample and analyzing the secondary electrons with a conventional spectrometer, eg a cylindrical mirror analyzer. Hovland suggests that the sample is coated in a thin layer on an aluminium substrate. A high-energy electron beam is then scanned across the surface of the aluminium substrate so that X-rays emitted at the point of contact of this beam and the aluminium pass through the substrate and irradiate a small area of the sample. This technique is limited to use with samples which can be coated on an aluminium substrate, which excludes a large proportion of the samples usually investigated by X-ray photoelectron spectrometry (XPS).

Electon microscopes having energy filters are well known in the art and some are described by H. Watanabe in J. Phys. Soc (Japan), 1962, vol. 17, pp 569, S. L. Cundy, et al, J. Sci. Instr., 1966, vol. 43, pp 712, D. B. Wittry, Brit. J. Appl. Phys, 1969, vol. 2 pp 1757, A. V. Crewe et al, Rev. Sci. Instr. 1971, vol 42 (1) p 411, J. W. Andrew, et al, Proc. Ninth Int. Congress on Electron Microscopy, Toronto, 1978, vol. 1 pp 40, and R. F. Egerton, et al, J. Phys. E, 1975, vol 8 p 1033.

At first sight it would appear that an energy filtered image of a surface which is emitting photoelectrons could be produced by an electron microscope fitted with such a filter, but in practice this is not possible. All the instruments described operate with a very high energy beam of electrons and the filters are used, for example, for energy analysing electrons which have lost energy by passing through the sample or for filtering so that only electrons having energies within a narrow band are used to form an image, thereby reducing the chromatic defects of the microscope. Typically they employ magnetic field energy filters such as that described by Castaing, R and Henry, L in J. Microscopie, 1964 vol. 3 (2) pp 133, or electrostatic lens filters such as that described by Mollenstedt and Rang in Z.Angew. Phys, 1951 vol 3 (5) pp 187. None employs the torroidal or spherical sector capacitor electrostatic analyzers conventionally used for the analysis of low energy secondary, photo or Auger electrons. Such instruments are therefore in fact unsuitable for imaging surfaces emitting electrons at low energies, as explained by Cazaux in Ultramicroscopy, 1984, vol 12 pp 321-. Cazaux coated a sample on a thin aluminium foil and produced the incident X-rays according to the method of Hovland, described above. The emitted electrons were passed through the lens systems of an electron microscope fitted with an energy filter of the type described by Castaing and Henry in an attempt to form an energy filtered image of the surface. However, Cazaux found the results were unsatisfactory and that the images obtained were in fact secondary electron images rather than photoelectron images. He further showed that the expected spatial resolution of the system would be low when used with photoelectrons, and the expected sensitivity would be so low as to make it very difficult to produce an image of adequate contrast with the small number of photoelectrons produced by XPS. In general therefore, the extensive technology developed for energy filtered microscopes is not applicable to low energy electron spectrometers, and especially to torroidal or spherical sector capacitor analyzers which have not been used in this way with an electron microscope.

It is well established in the field of surface analysis that an electron energy analyzer based on a torroidal capacitor is the type best suited for the analysis of low energy photoelectrons or Auger electrons. The term "torroidal capacitor" is used herein to relate to electrostatic energy analysers which comprise two electrodes which are sectors of torroidal surfaces and in which the equipotential surfaces are substantially sectors of torroidal surfaces, at least close to the electrodes. Most commonly the electrodes are sectors of spherical surfaces (one of the range of possible torroidal surfaces), often with a 180° sector angle, but various angles between 90° and 270° are also employed.

It is known that a properly designed analyzer of this type possesses a pair of conjugate planes which are such that a surface emitting monoenergetic electrons situated in one plane will produce a two dimensional image of that source in the other plane. The energy dispersion of the analyzer will cause this image to be dispersed according to electron energy along the energy dispersion axis of the spectrometer in the image plane, so that the spatial features of the image cannot be distinguished from the energy spectrum at least along this axis. N. Gurker, H. Ebel and M. F. Ebel, in Surface and Interface Analysis, 1983, vol.5 (1) pp 13 -, suggest that this can be overcome by imaging only a narrow strip of the sample disposed so that the image of the strip is perpendicular to the energy dispersion axis in the image plane. Because the strip is narrow, there is very little spatial detail along the energy dispersion axis of the spectrometer and the energy spectrum is independent of the image. A complete two-dimensional image can be produced by mechanically scanning the sample so that different linear strips are successively imaged by the spectrometer. An energy spectrum may be recorded at each position of the sample relative to the slit using a two-dimensional position sensitive detector situated in the image plane of the analyzer. This information can be processed by computer to yield complete two-dimensional images of the scanned region of the surface and energy spectra corresponding to each position of the sample. The chief disadvantage of this method is the requirement to use a narrow slit in the object plane of the spectrometer which clearly prevents a large majority of the emitted photoelectrons from reaching the detector. Consequently, the sensitivity of the technique is low, and in view of the relatively small number of electrons emitted in the first place, this represents a serious problem, as in the case of the methods previously described. Greater sensitivity is of course achieved by use of a wider entrance slit, but this clearly reduces the resolution of the energy spectrum and the spatial resolution along one axis.

It is an object of the present invention, therefore to provide an electron energy spectrometer with an analyzer of the torroidal capacitor type which is capable both of producing an energy spectrum of electrons emitted from a small area of a sample and of imaging at least a part of the surface of a sample using electrons of a selected energy, and which does not require the use of scanning techniques of any kind. Such an analyzer is consequently more efficient than previously known imaging analyzers, and overcomes the problem of producing an energy filtered image with low energy photoelectrons from XPS.

Viewed from one aspect the invention provides an electron spectrometer operable to produce an image of an electron emitting surface, said spectrometer comprising in sequence:

(a) means for causing electrons to be emitted from said surface;

(b) a first [electrostatic] lens system arranged to project at least some of said electrons onto a first diffraction plane as a Fourier transform of an electron image of at least a part of said surface;

(c) a torroidal capacitor type electrostatic energy analyzer having an object plane and conjugate thereto a first image plane, said analyzer being disposed with said object plane coincident with said first diffraction plane and being arranged to project electrons of said Fourier transform as an energy dispersed Fourier transform in said first image plane;

(d) energy selection means for transmitting electrons of said energy dispersed Fourier transform having energies only within a selected range; and (e) a second [electrostatic] lens system arranged to receive electrons transmitted by said energy selection means and therewith to project an electron image of at least a part of said surface onto a second image plane.

In the case of an electrostatic energy analyser in which the first image plane lies outside the electrodes, the second [electrostatic] lens system, *which may be an electrostatic lens system,* (which possesses a second diffraction plane) is disposed with the second diffraction plane coincident with the first image plane so that the final image is created in the second image plane.

Preferably a transfer electrostatic lens system is disposed between the surface and the first [electrostatic] lens system *which may be also be an electrostatic system* and is arranged to receive at least some of the electrons emitted from the surface and to produce an electron image of at least a part of the surface. If such a lens system is provided, the electron image it produces serves as the object for the first electrostatic lens system of the invention.

Preferably also, means disposed between the surface and the analyzer are also provided for allowing into the energy analyzer only those electrons which leave the surface in directions which make a certain range of angles to the surface. Further preferably, the electrons leaving the source are selected so that only those which are travelling in directions which make a certain range of angles to the axis of the first electrostatic lens system (or the transfer electrostatic lens system, if provided) are allowed into the energy analyzer.

In a further preferred embodiment, the electrodes comprising the electrostatic energy analyzer are sectors of spheres so that the analyzer comprises a part-spherical electrostatic analyzer, for example of the type conventionally used in electron spectrometers operating at low pass energies. However, non-spherical torroidal electrostatic analyzers may also be employed.

Preferably a first electron detecting means is provided in or adjacent to the second image plane for either visually displaying the electron image or for recording it electrically. Such means are conventional and may include a phosphor screen or a position sensitive detector, for example those described in U.S. Pat. No. 4,395,636 or by M. Lampton and R. F. Malina in Rev. Sci. Instruments, 1976, vol. 47 (11) p 1360. Other types of position sensitive detectors may be used. Preferably at least one channelplate electron multiplier is disposed with its entrance in the second image plane in front of the detector or the phosphor screen. However, where further magnification (or reduction) of the image produced by the second electrostatic lens system is desired, an image magnifying electrostatic lens system may be disposed between the second electrostatic lens system and the first electron detecting means.

In a yet further preferred embodiment, the apparatus is provided with means for adjusting the energy of electrons passing into the energy analyzer. Thus the potential of the central trajectory of the energy analyzer and the potential of the surface may be maintained at different values in order to accelerate or retard the electrons to an energy particularly suitable for analysis in the energy analyzer at a desired resolution. Typically the sample is maintained at ground potential, and the potential of the central trajectory of the analyser and at least the entrance and exit elements of the first and second electrostatic lens systems, are maintained at a second potential which can be adjusted to vary the degree of acceleration or retardation as required. It is particularly preferred that emitted electrons within the energy band to be imaged in each imaging procedure are accelerated or decelerated to the passband of the energy analyzer. Preferably that passband will be arranged about an energy of at least 50 eV, conveniently 50 to 200 eV and specially about 100 eV. The higher passband energy yields better spatial resolution in the final image.

In further preferred embodiments, either or both of the transfer electrostatic lens system (if provided) and the second electrostatic lens system are conveniently of variable magnification.

As well as providing an electron image of at least part of the sample surface, the invention offers the possibility of recording the electron energy spectrum of the electrons passing through the object plane of the energy analyzer. An electron detector similar to those described may be inserted into the path of the electrons in the analyser image plane in order to record the spectrum. As explained below, information relating to the spatial features of the surface exists in this plane in the form of the angles between electron trajectories and the plane while the energies are dispersed along the dispersion axis. Consequently a spectrum recorded in this plane is substantially free of interference from the spatial features of the specimen. Typically, the spectrum detector is fitted on a retractable mounting so that it can be withdrawn to allow the electrons to form a real image of the surface via the second electrostatic lens system. Alternatively, if a spectrum detector containing an aperture is used, the spectrum (except for the portion falling on the aperture) and the image may be simultaneously recorded. This is impossible on any previously known electron energy spectrometer suitable for analyzing Auger or photoelectrons. In such an apparatus the means for detecting the spatial image might if desired be omitted, and thus viewed from a further aspect the invention provides an electron spectrometer comprising elements (a) to (c) as defined above and having an electron detecting means disposed for the detection of electrons in said energy dispersed Fourier transform.

The first and second electrostatic lens systems of the invention each may conveniently comprise one or more electrostatic lenses, typically a simple conventional three element cylinder lens.

If provided, the transfer electrostatic lens system forms in the object plane of the first electrostatic lens system an electron image of the sample surface. Typically it comprises at least two, and preferably three electrostatic lenses, each of which is a conventional three elements lens. This allows the magnification of the transfer lens system to be selected independently of the position along the axis of the image it produces. Such a system will desirably be arranged to provide image magnification of a factor of at least 16, preferably at least 25, and especially at least 50, and a system capable of variable magnification in the range $\times 16$ to $\times 64$ is particularly preferred.

Advantage may also be gained by providing a similar variable magnification system in the second electrostatic lens system of the invention. The simple three-element lens referred to above may then be replaced by a multi-element two or three-lens system.

Preferably the electrostatic energy analyzer is of the spherical sector type. Any suitable sector angle, generally between 90° and 270° can be employed. Sector angles of 190° or less, for example 150° to 190°, are preferred for reasons of facility of component mounting, but especially good results can be obtained with a sector angle of about 180°. The sectors of such an analyzer typically do not physically extend to the image and object planes, so that room is left for the input and output slits which need to be positioned in the image and object planes. Analyzers of this type are known in the art and need not be described further.

Viewed from another aspect the invention provides a method of forming an image of an electron emitting surface, said method comprising:

(a) causing electrons to be emitted from a surface;

(b) passing at least some of said electrons through a first [electrostatic] field arranged to produce in a first diffraction plane a Fourier transform of an electron image of at least a part of said surface;

(c) passing at least some of the electrons of said Fourier transform which travel through said first diffraction plane through a second electrostatic field generated by a torroidal capacitor type electrostatic analyzer having an object plane and a first image plane, said object plane being coincident with said first diffraction plane, thereby to produce an energy dispersed Fourier transform in said first image plane;

(d) selecting electrons which have energies within a selected range; and (e) passing said selected electrons through a third [electrostatic] field arranged to focus them to form in a second image plane a second electron image comprising electrons having energies within said selected range.

*The first and third fields may advantageously be electrostatic fields.*

Preferably the electrons emitted from the surface are passed through a transfer electrostatic field before the first electrostatic field. The transfer electrostatic field is adapted to focus the electrons to produce an image which serves as an object for the first electrostatic field.

Preferably also the method of the invention incorporates the step of selecting electrons which are travelling in directions which make a certain range of angles to the surface before they enter the first electrostatic field.

In a further preferred embodiment, the method comprises the step of changing the energy of the electrons before they enter the second electrostatic field so that their energies lie within a range in which the desired energy resolution is obtained following energy dispersion by the second electrostatic field.

In a yet further preferred embodiment, the equipotential surfaces of the second electrostatic field are part-spherical. Preferably also, the energy of the electrons emitted from the surface is changed to a value at which the energy analyzer will give the desired energy resolution. This is a conventional mode of operation of an electron spectrometer used for the analysis of Auger or photoelectron. See for example, Brundle, Roberts, Latham and Yates, in J. Electron Spectroscopy and Related Phenomena, 1974, Vol 3 pp 241-261. It will also be appreciated that a spectrum of the energies of the electrons passing through the second electrostatic field exists in its image plane and can be recorded if required. This spectrum is such that there is substantially no spatial information contained in it. Further, the resolution of the image formed in the second plane is substantially unaffected by the energy spread of the electrons which it comprises.

In this way the problem of separating the energy dispersion and the spatial imaging properties of a torroidal capacitor electron energy analyzer can be overcome. In a preferred embodiment, a sample is bombarded with photons (X-rays, UV light, etc) to emit photoelectrons, or with electrons to emit Auger electrons, and some of the emitted electrons are collected by the transfer lens system which produces an image of the surface. As in a conventional analyzer, the energy of the electrons may be varied by changing the electrical potential of their environment, usually to retard them so that the pass energy of the analyzer can be set at a relatively low value, increasing the energy resolution. In a conventional spectrometer, such as that described by Gurker, Ebel and Ebel (described previously), the transfer lens system causes an image of the surface to be formed on the object plane of the energy analyzer, which in turn forms an energy dispersed image of the sample in its image plane where a position sensitive detector is located. By contrast, in the present invention the first lens system is interposed between the image plane of the transfer lens system and the object plane of the energy analyzer. In the simplest case when the first lens system comprises only a single thin lens, this will be disposed so that the transfer lens system image plane and the analyzer object plane are each situated at a distance from the first lens system equal to the focal length of the first lens system. Thus the object plane of the analyzer coincides with a diffraction plane of the first lens system in which a Fourier transform of the surface image exists. Electrons leaving a particular point on the sample surface in directions which make a certain range of angles to the surface will pass through the diffraction plane of the first lens system in the form of a substantially parallel beam inclined at a specific angle to the plane, while electrons leaving a different point on the surface pass through the plane at a different angle. Thus there is substantially no intensity variation in the plane due to the spatial features of the surface. The torroidal capacitor energy analyzer forms an "image" of this diffraction plane in its image plane and also introduces energy dispersion of the electrons along one axis (its dispersion axis). Thus electrons from different points on the sample pass through the image plane of the analyzer at different angles, but are displaced along the dispersion axis according to their energy. Consequently the intensity varies along this axis according to the energy of the electrons, while it is largely independent of the point on the sample from which the electrons originate (assuming a uniform sample surface). This allows a complete energy spectrum, substantially independent of the spatial features of the surface, to be recorded in the image plane of the analyzer.

If, however, the electrons passing through the image plane of the analyzer are received by a second lens system suitably situated then another image of the surface will be formed by that lens, i.e., the second lens system reverses the effect of the first lens system. In the case where the second lens system is a single thin lens, this will be disposed so that the image plane of the analyser is spaced from the lens by a distance equal to its focal length, and the image will be produced in the image plane of the lens, also spaced from the lens by a distance equal to its focal length. This image is independent of the energy dispersion of the electron distribution in the analyzer image plane because it comprises a Fourier transform of the analyzer image plane and is consequently dependent only on the angles at which the electrons pass through that plane. The energy band of the electrons comprising this image can of course be selected by varying the pass energy of the analyzer, the difference in potential between the sample and the central trajectory of the analyzer (i.e. The retarding ratio), and/or the width of a slit situated in its image plane.

It is also desirable to limit the angular range of electron trajectories entering the analyzer by means of anothe slit disposed in the object plane of the analyzer.

It is therefore possible to select electrons characteristic of a particular element in the surface and produce an image of the distribution of that element over the surface. Alternatively, the energy spectrum of electrons from a particular region of the surface can be recorded. A suitably shaped aperture disposed in the transfer lens system in a plane where an image of the surface is formed can be used to select the region of the sample to be imaged by the spectrometer. It will also be seen that by using a detector in the analyzer image plane which contains an aperture to allow some electrons to enter a third lens, a large part of the spectrum can be recorded simultaneously with the production of an image of the surface. Alternatively, a detector may be used which contains an aperture or slit which extends only part way along the axis in the image plane of the analyzer substantially perpendicular to the dispersion axis. In this way a complete energy spectrum can be recorded in one part of the image plane while an image of the surface can be created from the electrons which pass into the final lens through the aperture in the detector.

This process is clearly more efficient than a scanning process and uses the maximum possible number of the electrons emitted by the surface.

A preferred embodiment of the invention will now be described in greater detail by reference to the following figures in which:

FIG. 1 is a schematic drawing of an embodiment of the spectrometer of the invention showing the positions of the various lens elements and images;

FIG. 2 is a diagram of the object and image planes of an electron energy analyzer suitable for use in the spectrometer of the invention, illustrating some of the parameters referred to below;

Figure 3:
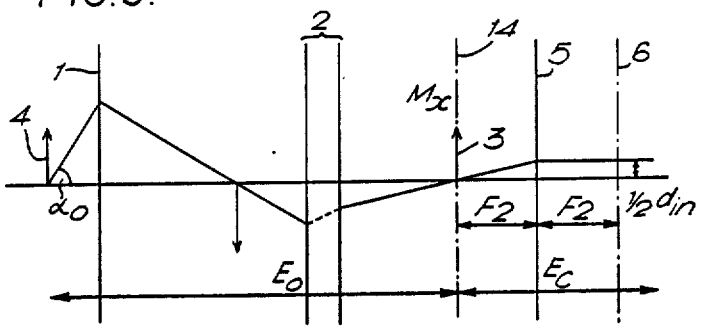
FIG. 3 is a schematic drawing of a transfer lens system and first electrostatic lens system suitable for use with the invention.

Referring first to FIG. 1, electrons emitted by an object 4 are focused by a transfer lens system described in detail below, which comprises electrostatic lenses 1 and 2. The transfer lens system produces a real image 3 of the object 4. Image 3 is located a distance $F_2$ from a first electrostatic lens system 5, which in turn is located at $F_2$ from the object plane 6 of a hemispherical capacitor electron energy analyzer, the central trajectory of which is shown at 7. Object 4, and the transfer lens system entrance and exit elements (15 and 25, FIG. 5) are maintained at ground potential while the potential of central trajctory 7 and the entrance and exit elements of lens system 5 (27 and 32, FIG. 5) is adjusted to obtained the desired retardation (or acceleration) of the electrons before they enter the energy analyzer. In the case when lens system 5 is a single thin lens, distance $F_2$ is made equal to the focal length of lens system 5, so that a Fourier transform of image 3 exists in object plane 6. Electrons passing through plane 6 pass into the energy analyzer, and those having energies within the range passed by the analyzer pass through the analyzer image plane 8 which is conjugate to plane 6. An aperture disposed in plane 8 allows the passage of electrons with a selected range of energies, as in a conventional electron energy spectrometer. The Fourier transform of image 3 which exists in plane 6 is therefore reproduced in plane 8, but with energy dispersion of the electrons comprising it along an axis lying in plane 8, as explained. A second electrostatic lens system 9, disposed at a distance $F_3$ from plane 8 (where $F_3$ is the focal length of lens system 9, assuming that lens system 9 is a single thin lens), causes a second electron image 10 of object 4 to be formed at a distance $F_3$ from lens system 9 from the electrons passing through the aperture in plane 8. In other words, lens system 9 operates to convert electrons having energies within the selected range from the energy dispersed Fourier transform existing in plane 8 into the image 10 which is recorded in a conventional way using a position sensitive detector. As explained, image 10 is not affected by the energy dispersion which exists in plane 8.

Referring next to FIG. 2, R is the radius of the central trajectory 7 of a part-spherical energy analyzer having its entrance face 11 and exit face 12 both inclined at an angle $\theta$ to the object plane 6 and image plane 8, respectively. Also shown in FIG. 2, $r(\phi)$ is the polar coordinate of the trajectory 13 of an electron which has travelled an angle $\phi$ through the analyzer from entrance face 11.

It can be shown that the position of the electron on trajectory 13 is given by equation [1]:

$$\frac{r(\phi)}{R} = 1 + \epsilon(1 - \cos\phi) + \alpha(\tan\theta\cos\phi + \sin\phi) + p\cos\phi + \epsilon^2(\cos^2\phi - \cos\phi) + \alpha^2(-\tan^2\theta\sin^2\phi + \cos\phi - \cos^2\phi + 2\tan\theta\sin\phi\cos\phi) + \alpha p(-2\tan\theta\sin^2\phi + 2\sin\phi\cos\phi) + p^2(-\sin^2\phi) + \alpha\epsilon(2\sin\phi - 2\sin\phi\cos\phi + 2\tan\theta\sin^2\phi) + \epsilon p(2\sin^2\phi) + \text{etc.} \quad [8]$$

In equation [1], p is the normalised height of an object situated in the object plane 6 of the analyzer, (i.e. the actual height $= Rp$), $\alpha$ is the angle between the normal to face 11 and the direction at which electrons which will travel through the analyser on trajectory 13 approach face 11, and $\epsilon.E_c$ is the difference in energy between the electrons travelling along trajectory 13 and the pass energy $E_c$ of the analyzer.

At the exit face 12 of the analyzer, $\phi = 180° - 2\theta$, so that from equation [1], $$\frac{r_2(\phi)}{R} = 1 + \epsilon(1 + \cos 2\theta) + \alpha(-\tan\theta\cos 2\theta + \sin 2\theta) + p(-\cos 2\theta) + \epsilon^2(\cos^2 2\theta + \cos 2\theta) + \alpha^2(-\tan^2\theta\sin^2 2\theta - \cos 2\theta - \cos^2 2\theta - 2\tan\theta\sin 2\theta\cos 2\theta) + \alpha p(-2\tan\theta\sin^2 2\theta - 2\sin 2\theta\cos 2\theta) + p^2(-\sin^2 2\theta) + \alpha\epsilon(2\sin 2\theta + 2\sin 2\theta\cos 2\theta + 2\tan\theta\sin^2 2\theta) + \epsilon p(2\sin^2 2\theta) + \text{etc.} \quad [2]$$

At the exit face 12 of the analyzer, the gradient of the trajectory 13, $$\frac{1}{r} \cdot \frac{dr}{d\phi},$$

is given by equation [3]:

$$\tan\alpha_2 = \frac{1}{r_2}\left[\frac{dr}{d\phi}\right]_{\phi=\phi_2} \quad [3]$$

In equation [3], $\alpha_2$ is the angle at exit face 12 between the trajectory 13 and the normal to face 12, (on the electron approach side of face 12), and $r_2$ is the value of r at $\phi = \phi_2$, where $\phi_2$ is the value of $\phi$ at face 12.

From equations [1]–[3], the following expressions can be derived:

$$\alpha_2' = \epsilon(2\sin\theta\cos\theta) - \alpha + p(-2\sin\theta\cos\theta) + \epsilon^2(-2\sin\theta\cos\theta) + \alpha^2(-2\sin\theta\cos\theta) + \epsilon\alpha(4\sin^2\theta) + \epsilon p(4\sin\theta\cos\theta) + \text{etc.} \quad [4]$$

-continued where $\alpha_2'$ is the angle at the exit face 12 between the trajectory 13 and the normal to face 12, on the electron exit side of face 12 and $$p_2 = 2\epsilon - p + \epsilon^2(+2 - 4\sin^2\theta + 4\sin^4\theta) + \alpha^2(-2 - 2\tan^2\theta\sin^2\theta + 2\tan^2\theta\sin^4\theta + 4\sin^4\theta) + p^2(-4\sin^2\theta + 4\sin^4\theta) + \alpha p(-4\sin\theta\cos\theta) + \alpha\epsilon(8\sin\theta\cos\theta + 4\tan\theta\sin^2\theta) + \epsilon p(12\sin^2\theta - 8\sin^4\theta) + \text{etc.} \quad [5]$$

in which $p_2$ is the normalized displacement of the electron trajectory 13 from the central trajectory 7 on image plane 8 (i.e., the actual displacement $= R_{p2}$).

It is clear from equations [4] and [5] that it is preferable to utilize an energy analyzer in which $\theta = 0$, that is, a 180° sector analyzer, because when $\theta = 0$, the second order terms in the equations become zero and the aberrations of the analyzer are consequently minimized. However, it is within the scope of the invention to utilize an analyzer in which $\theta \neq 0$. The procedure for selecting the optimum embodiment for such an instrument will be similar to the following example which is given for a 180° analyzer, but equations [4] and [5] must be substituted for equations [6] and [7], and the most important aberrations minimized by an appropriate design.

In the case of a 180° sector analyzer, $\theta = 0$ and equations [4] and [5] respectively become:

$$\alpha_2' = -\alpha(+\text{3rd. order terms}) \quad [6]$$

and $$p_2 = 2\epsilon - p + 2\epsilon^2 - 2\alpha^2 + (\text{3rd. order terms}) \quad [7]$$

Assuming that the coefficients of the third order terms are approximately unity, it follows from equations [6] and [7] that the angular error $\Delta\alpha_2'$ (which gives rise to a blurring of the image after the electrons have passed through lens 9) will not be greater than about $10^{-4}$ when $\alpha$, $\epsilon$, and p do not exceed approximately 0.05, which is easily achieved in practice. Therefore, if the focal length of lens 9 ($F_3$, FIG. 1) is 150 mm, the displacement error $F_3\Delta\alpha_2'$ in the final image 10 will be approximately 15 micron, that is, about the same as the resolution of a conventional position sensitive electron detector. Thus the focal length of lenses 5 and 9 may conveniently be 150 mm, making the aberrations of the analyzer approximately equal to the resolution of the detector.

If, however, a 150° sector analyzer is used, $\theta = 15°$ and the spatial resolution $F_3\Delta\alpha_2'$ (when $\alpha$, $\epsilon$ and p do not exceed 0.05) is of the order of several mm when $F_3 = 150$ mm, which clearly illustrates the advantage of using a 180° sector analyzer.

As explained, the potentials applied to lens system 5 and to the analyzer electrodes may also be arranged to change the energy of the electrons emitted from the sample to be desired pass energy of the analyzer. This should be done without significantly degrading either the spatial or the energy resolution of the analyzer. A practical design may be arrived at in the following way.

One way of ensuring that the magnification of the system is independent of the analyzer pass energy is to make the retardation plane coincide with a spatial image. Further, after retardation, the angular divergence of the beam becomes much greater, and the chromatic aberrations of the various lenses are likely to become the most important factors controlling the overall spatial resolution.

Considering the system of lenses illustrated in FIG. 3, plane 14 represents the retardation plane of the lens system which is coincident with image 3. To the left of plane 14, electrons have energy $E_0$ while to the right they have energy $E_c$, the pass energy of the analyzer.

The contribution to the chromatic aberration at the object 4 from lens system 5 is given by equation [8]:

$$\Delta_c = \frac{1}{M^2}\left[\frac{E_0}{E_c}\right]^{3/2} C_c(5)\cdot\alpha_0\cdot\frac{dE}{E_0} \qquad [8]$$

where $\Delta_c$ is the contribution to the chromatic aberration due to lens 5 at object 4, $\alpha_0$ is the angular divergence of the electron beam at object 4, $C_c(5)$ is the chromatic aberration coefficient of lens 5, M is the magnification of image 3 with respect to object 4 by lenses 1 and 2, and dE is the energy passband of the analyzer.

In order to ensure that the effect of the chromatic aberration due to lens 5 is acceptably small, the magnification M of lenses 1 and 2 must be made large enough to overcome the amplification $(E_0/E_c)^{3/2}$ of the chromatic aberration coefficient of lens system 5. Typical operating conditions might be $E_0=885$ eV and $E_c=12.5$ eV, so that $M=24.4$ when $(E_0/E_c)^{3/2}/M^2=1$.

Therefore, if the chromatic aberration of lens 5 is to be insignificant in comparison with that of the objective lens system, $M \geqq \geqq 24$. This implies that the retardation should preferably take place at image 3 rather than at any previous image where the magnification would be smaller, and the contribution of the chromatic aberration from lenses between the retard plane and lens system 5 would be correspondingly larger.

Considering next the effect of spherical aberration of the lenses on the spatial resolution of the system, the contribution $\delta_s$ to the resolution from spherical aberration is given by equation [9]:

$$\delta_s = \tfrac{1}{4}C_s\alpha_0^3 \qquad [9]$$

where $C_s$ is the spherical aberration coefficient of the entire lens system, which will be dominated by the spherical aberration of the objective lens system 1.

The contribution $\delta_c$ to the resolution from the chromatic aberration is given by equation [10]:

$$\delta_c = C_s\alpha_0 . dE/E_0 \qquad [10$$

where $C_c$ is the chromatic aberration coefficient of the entire lens system.

As explained previously, providing that M is sufficiently high, only lens system 5 and lens system 1 will contribute significantly to the total aberrations. Therefore, $$C_c = C_c(1) + C_c(5)\cdot\frac{(E_0/E_c)^{3/2}}{M^2} \qquad [11]$$

where $C_c(1)$ is the chromatic aberration of lens system 1. Chosing $$\delta_s = \delta_c = \delta, \qquad [12]$$

and from equations [9] and [10], $$dE = \left[\frac{C_s}{4}\right]^{\frac{1}{2}}\cdot\frac{E_0}{C_c}\cdot\delta^{\frac{1}{2}} \qquad [13]$$

and from equation [9], $$\alpha_0 = \left[\frac{4\delta}{C_s}\right]^{\frac{1}{4}} \qquad [14]$$

In the case where the width of electron beam at object plane 6 ($d_{in}$) is small, then dE can be controlled by selection of the exit slit width ($d_{out}$), so that $$d_{out} = (2R.dE/E_c) - d_{in} \qquad [15$$

Further, from the Lagrange-Helmholtz relationship, $$d_{in} = \frac{2F_2\alpha_0}{M}\left[\frac{E_0}{E_c}\right]^{\frac{1}{2}} \qquad [16]$$

so that from [15], $$d_{out} = 2R\cdot\frac{dE}{E_c} - \frac{2F_2\alpha_0}{M}\left[\frac{E_0}{E_c}\right]^{\frac{1}{2}} \qquad [17]$$

Alternatively, in the case where $d_{in}$ is greater than the desired value of $d_{out}$, then $\alpha_0$ and dE must be adjusted so that the input beam width is equal to $d_{out}$, so that $$d_{in} = d_{out} = R(dE/E_c)$$

and $$\delta = \delta_c \text{ while } \delta_s < \delta_c \qquad [18]$$

From equations [12], [16] and [18], $$\alpha_0 = \frac{MR}{2F_2}\cdot\frac{dE}{E_c^{\frac{1}{2}}E_0^{\frac{1}{2}}} \qquad [19]$$

and $$dE = \left[\frac{2F_2}{MRC_c}\right]^{\frac{1}{2}} E_c^{\frac{1}{2}}E_0^{\frac{1}{2}}\delta^{\frac{1}{2}} \qquad [20]$$

In equations [9]–[20], $\delta$ represents the blurring of the final image referred to object 4, that is, the smallest element which can be resolved by the system.

The count rate X' from an image area $\delta^2$ into a cone of semi-angle $\alpha_0$ is given by equation [21]:

$$X' = \beta'(E_0)dE\cdot\pi\cdot\alpha_0^2\delta^2 \qquad [21]$$

where $\beta'(E_0)dE$ is the brightness of the electrons emitted from the object 4 in the energy band $E_0$ to $(E_0+dE)$. From equations [10], [12], and [21], $$X' = \beta'(E_0) \cdot \pi \cdot \frac{E_0^2}{C_c^2} \cdot \frac{\delta^4}{dE} \quad [22]$$

Equation 22 shows that in order to maximise X' for a given resolution $\delta$, $C_c$ and dE must both be minimized.

From equation [11] it can be seen that if M is very large, the minimum value of $C_c$ is $C_c(1)$, and because it is always possible to reduce $d_{in}$ so that equation [13] rather than equation [20] is operative, the maximum value of X' (X'(max)) will be given by equation [23]:

$$X'(max) = \beta'(E_0) \cdot \pi \left[\frac{4}{C_s}\right]^{\frac{1}{3}} \frac{E_0}{C_c(1)} \cdot \delta^{10/3} \quad [23]$$

Values of dE, $d_{out}$, $\alpha_0$ and X' can be calculated for any proposed arrangement of lenses from equations [13], [17], [14] and [22] in the case when $d_{in} < d_{out}$ or from equations [20], [18], [19] and [22] when $d_{in} = d_{out}$.

Table 1 lists some typical values for chosen values of $\delta$, $E_c$ and M.

TABLE 1

| | $\delta$ ($\mu$m) | $E_c$(eV) M | 12.5 16 1440 | 12.5 64 399 | 50 16 469 | 50 64 339 | 100 16 379 | 100 64 333 |
|---|---|---|---|---|---|---|---|---|
| | | $C_c$(mm) | | | | | | |
| dE | 2.5 | | 0.14 | 0.25 | 0.35 | 0.29 | 0.47 | 0.30 |
| (eV) | 10 | | 0.28 | 0.62 | 0.70 | 0.73 | 0.93 | 0.75 |
| | 40 | | 0.56 | 1.57 | 1.41 | 1.85 | 1.86 | 1.88 |
| $d_{out}$ | 2.5 | | 1.71 | 5.11 | 1.06 | 1.30 | 0.70 | 0.59 |
| (mm) | 10 | | 3.41 | 13.5 | 2.11 | 3.68 | 1.40 | 1.75 |
| | 40 | | 6.82 | 35.5 | 4.23 | 9.99 | 2.80 | 4.85 |
| $\alpha_o$ | 2.5 | | 11 | 22 | 15 | 22 | 13 | 22 |
| (mrad) | 10 | | 22 | 36 | 27 | 36 | 25 | 36 |
| | 40 | | 43 | 57 | 54 | 57 | 50 | 57 |
| | | X'(max) | | | | | | |
| X' | 2.5 | 0.08 | 0.01 | 0.07 | 0.03 | 0.08 | 0.04 | 0.08 |
| (cps) | 10 | 8.4 | 1.19 | 6.99 | 4.47 | 8.21 | 5.16 | 8.28 |
| | 40 | 854 | 152 | 706 | 569 | 830 | 660 | 846 |

The underlined values in Table 1 are those for which $d_{in} = d_{out}$.

The values of $C_s$ and $C_c$ required in the equations can be found from the tables for electrostatic lenses given by E. Harting and F. M. Read in "Electrostatic Lenses", Elsevier, 1976. Note that $C_s$ is assumed to be due almost entirely to lens system 1 (equation [9]), and in practice the first element of lens system 1, while $C_c$ is determined by lens system 1 and also lens 5 (equation [11]). In Table 1, the following dimensions have been used:

lens 5: focal length ($F_3$) = 150 mm diameter = 60 mm lens 1: focal length = 64 mm diameter = 32 mm Other parameters used to determine $C_s$ and $C_c$, using the terminology of Harting and Read, and A/D = 1, G/D = 0.1, $D_1 = D_2$, and $V_1 = V_3$, which are typical for conventional three element lenses.

The contribution of lens 9 to the overall aberrations can be estimated from equations [24] and [25], which give the spherical ($\Delta_s(9)$) and chromatic ($\Delta_c(9)$) aberrations due to lens 9, referred back to the plane of object 4. The semi-angle of a cone of electrons converging on a point in the image 10 after transversing lens system 9 is $d_{out}/2F_3$, where $F_3$ is the focal length of lens 9, so that if lenses 5 and 9 are identical (i.e., the magnification of image 10 relative to object 4 is equal to the magnification of image 3 relative to object 4), $$\Delta_s(9) = \tfrac{1}{3} C_s(9) \left[\frac{d_{out}}{2F_3}\right]^3 \left[\frac{1}{M}\right] \quad [24]$$

and $$\Delta_c(9) = C_c(9) \left[\frac{d_{out}}{2F_3}\right] \left[\frac{dE}{2E_c}\right] \left[\frac{1}{M}\right] \quad [25]$$

in which $C_s(9)$ and $C_c(9)$ are respectively the spherical and chromatic aberration coefficients of lens 9, which can be found from the tables given by Harting and Read. Using equations [24] and [25] it can be shown that $\Delta_s(9)$ and $\Delta_c(9)$ are insignificant in comparison with a chosen value of $\delta$ providing that M is approximately 25 or greater, and E is 50 eV or greater.

Table 1 also shows that the highest values of X' are obtained by using the highest values of $E_c$ (50 and 100 eV). Also, $\Delta_s(9)$ and $\Delta_c(9)$ are less than 1% and 20% of $\delta$ respectively when using the highest values of $E_c$ (50 and 100 eV) when M is either 16 or 64. Consequently a preferred embodiment utilizes a pass energy of between 50 and 100 eV and a variable magnification of between 16 and 64, selected to suit the fineness of detail and the field of view required. Optimum values of $\alpha_o$ and $d_{out}$ for a given resolution will vary slightly with M, but this is not a serious problem. In general there is a unique combination of $\alpha_o$ and $d_{out}$ for given values of M, $E_c$ and $E_o$ which yields the maximum count rate at a given resolution $\delta$, and these values can be predicted for the preferred embodiment from the equations given.

Following the procedure outlined, similar sets of equations can be derived for any particular type of analyzer and lens system, and the parameters optimised for maximum performance.

Figure 4:
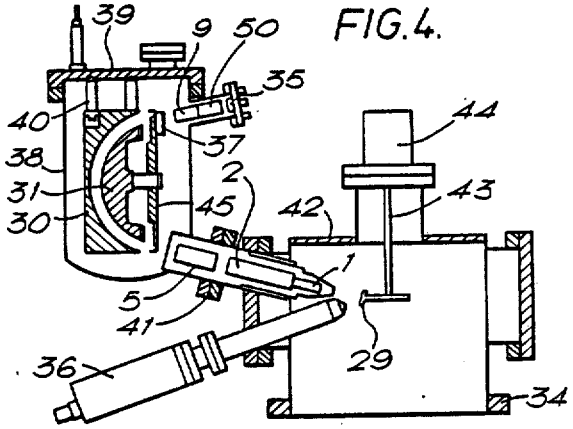
FIG. 4 is a drawing of the major components of a spectrometer according to the invention.

The disposition of the major components of the invention is shown in FIG. 4. The energy analyzer comprises an outer hemispherical electrode 30 supported on insulators 40 from a lid 39 of analyzer vacuum housing 38. Inner hemispherical electrode 31 is supported from electrode 30 by other insulated supports (not shown). Housing 38 is connected by means of flange 41 to sample chamber 42 which in turn is connected by flange 34 to a vacuum pump, typically a diffusion pump (not shown). Sample 29 is supported with the surface to be examined disposed in the plane of object 4 (FIG. 1) by means of rod 43 from a manipulator 44. The energy analyzer entrance and exit apertures are mounted on one or more rotatable plates 45 so that different pairs of slits can be brought into use by rotating the plates. An electron detector 37, preferably a position sensitive detector, is conveniently mounted on one of rotatable plates 45 to enable the energy spectrum to be recorded when required. Detector 37 may also contain an aperture to permit simultaneous recording of the energy spectrum using detector 37 and a spatial image using detector 35 (discussed below).

A primary beam generator 36 is also fitted to chamber 42, and irradiates sample 29 with a beam of particles or radiation which cause emission of secondary, photoelectrons or Auger electrons from the sample. Generator 36 is typically an X-ray, electron, ion beam or U.V. light source. In common with all surface investigation apparatus of this type, the pressure in chamber 42 and housing 38 is maintained at $10^{-8}$ torr or lower.

The various electrostatic lens systems are disposed adjacent to the entrance and exit apertures of the analyzer, as shown in FIG. 4. A position sensitive detector 35 is used to record the image of the sample which is formed in the image plane of lens 9. Detector 35 preferably comprises a wedge and strip detector, as explained. Electronic signal processing equipment of generating a visual or printed image from such a detector is well known in the art.

In the case where a magnified image of the image produced by lens system 9 is required on detector 35, the second electrostatic lens system of the invention may comprise both lens system 9 and an auxiliary lens system 50 (FIG. 4 which is preferably a zoom lens with variable magnification. Lens 50 may then be used to match the resolution of the final image produced by the second electrostatic lens system to the resolution of detector 35.

The power supplies required to maintain the various electrodes of the spectrometer system at the required potentials are also well known in the art.

If an apertured detector 37 is used to detect an energy spectrum simultaneously with the detection of the spatial image using detector 35 then a gap will exist in the recorded spectrum caused by the aperture in detector 37. Providing that this gap is not large compared with the fine detail of the adjacent parts of the energy spectrum, the missing spectrum can be interpolated using the integrated count rate from detector 35.

Figure 5:
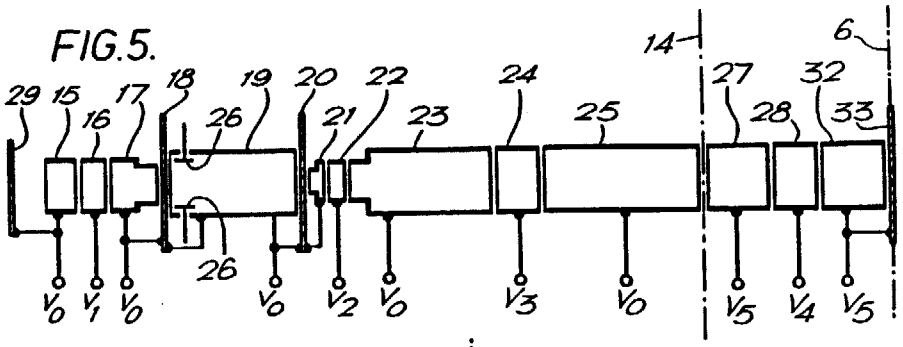
FIG. 5 is a drawing illustrating a practical embodiment of the transfer lens system and first electrostatic lens system shown in FIG. 3.

FIG. 5 illustrates a practical embodiment of the transfer lens system and first electrostatic lens system of the invention. An objective lens comprises the three elements 15, 16 and 17 which are maintained at potentials $V_o$, $V_1$ and $V_o$, respectively. The objective lens is adapted to form an image of the surface of sample 29 in the plane of aperture plate 20. The aperture in plate 20 is preferably adjustable in size in order to select the portion of the surface to be imaged. A second adjustable aperture plate 18, is disposed as shown in the focal plane immediately following the objective lens, which is situated at a distance approximately equal to the focal length of the objective lens from the centre of element 16. The aperture in plate 18 is used to control the angle $\alpha_o$. Transfer tube 19 is provided to ensure that the paths of the electrons are not affected by stray electrosatic fields. Sample 29, aperture plates 18 and 20, and tube 19 are maintained at potential $V_o$, usually earth, while $V_1$ is adjusted to cause an image to be formed in the plane of aperture plate 20. A stigmator, comprising eight electrodes 26 disposed symmetrically at one end of transfer tube 19, is also provided to enable the astigmatism introduced by the lens system to be corrected.

Lens elements 21, 22, 23, 24 and 25 comprise a pair of electrostatic lenses which form an image in the retardation plane 14 from the image formed at aperture plate 20 by lens system 1. Potentials $V_2$ and $V_3$, applied to elements 22 and 24 respectively, are adjusted to set the magnification of the lens system to the desired value. Elements 21, 13 and 25 are maintained at potential $V_o$. Elements 21, 22 and 23 (left hand part) are conveniently 20 mm diameter and elements 23 (right hand part), 24 and 25 may be 60 mm diameter.

Elements 27, 28 and 32 comprise lens system 5 (FIG. 1), and are maintained at potentials $V_5$, $V_4$ and $V_5$ respectively. The aperture in aperture plate 33 comprises the entrance aperture of the energy analyzer which is disposed in plane 6 (FIGS. 2 and 3). Electrons passing through the retardation plane 14, which lies between lens elements 25 and 27, are retarded (or accelerated, if $V_5$ is more positive than $V_o$) as they pass from potential $V_o$ to potential $V_5$ and the electrons which will form the detected spatial image emerge with energy $E_c$ (the pass energy of the analyzer). The function of lens system 5 has been described earlier.

Figure 6:
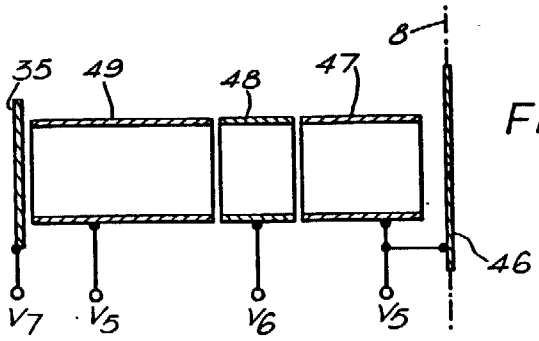
FIG. 6 is a drawing illustrating an output lens and detector suitable for use with the invention.

FIG. 6 illustrates a suitable practical arrangement for the second electrostatic lens system 9. Elements 47, 48 and 49, maintained at potentials $V_5$, $V_6$ and $V_5$ respectively, comprise a three element lens which forms an image on position sensitive detector 35 in the manner described. Aperture plate 46, disposed in plane 8, provides the exit aperture of the energy analyzer. The potential $V_7$ of the detector 35 is maintained several hundred volts more positive than $V_5$ in order that electrons leaving the lens are accelerated and impact the detector with sufficient energy to ensure efficient operation of the detector.

It will be understood that the lens systems shown in FIGS. 5 and 6 is intended only as an example, and that other arrangements may be used.

We claim:

1. An electron spectrometer operable to produce an image of an electron emitting surface, said spectrometer comprising in sequence:
   (a) means for causing electrons to be emitted from said surface;
   (b) a first [electrostatic] lens system arranged to project at least some of said electrons onto a first diffraction plane as a Fourier transform of an electron image of at least a part of said surface;
   (c) a torroidal capacitor type electrostatic energy analyzer having an object plane and conjugate thereto a first image plane, said analyzer being disposed with said object plane coincident with said first diffraction plane and being arranged to project electrons of said Fourier transform as an energy dispersed Fourier transform in said first image plane;
   (d) energy selection means for transmitting electrons of said energy dispersed Fourier transform having energies only within a selected range; and
   (e) a second [electrostatic] lens system arranged to receive electrons transmitted by said energy selection means and therewith to project an electron image of at least a part of said surface onto a second image plane.

2. A spectrometer as claimed in claim 1 further comprising a transfer electrostatic lens system disposed between said surface and said first [electrostatic] lens system and arranged to receive electrons emitted from said surface and therewith to project an electron image.

3. A spectrometer as claimed in claim 2 wherein said transfer electrostatic lens system has a magnification of at least 16 times.

4. A spectrometer as claimed in claim 3 wherein said transfer electrostatic lens system has a magnification adjustable in a range between 16 times and 64 times.

5. A spectrometer as claimed in claim 1 further comprising means, disposed between said surface and said energy analyzer, for allowing into said analyzer only electrons which have left said surface in directions which make a selected range of angles thereto.

6. A spectrometer as claimed in claim 1 having a first electron detector means arranged in said second image plane.

7. A spectrometer as claimed in claim 6 further comprising a retractably mounted second electron detector means arranged for disposition in said first image plane.

8. A spectrometer as claimed in claim 6 further comprising an apertured second electron detector means disposed in said first image plane.

9. A spectrometer as claimed in claim 1 wherein said energy analyzer is a part-spherical capacitor type electrostatic energy analyzer.

10. A spectrometer as claimed in claim 9 wherein the angle between said first image plane and said object plane is in the range of from 150° to 190°.

11. A spectrometer as claimed in claim 1 wherein said energy analyzer is arranged to maintain the central trajectory thereof at a potential different from that of said surface.

12. A spectrometer as claimed in claim 11 wherein said energy analyzer is arranged for operation at a pass energy of at least 50 electron volts.

13. A method of forming an image of an electron emitting surface, said method comprising:

(a) causing electrons to be emitted from a surface;

(b) passing at least some of said electrons through a first [electrostatic] field arranged to produce in a first diffraction plane a Fourier transform of an electron image of at least a part of said surface;

(c) passing at least some of the electrons of said Fourier transform which travel through said first diffraction plane through a second electrostatic field generated by a torroidal capacitor type electrostatic analyzer having an object plane and a first image plane, said object plane being coincident with said first diffraction plane, thereby to produce an energy dispersed Fourier transform in said first image plane;

(d) selecting electrons which have energies within a selected range; and (e) passing said selected electrons through a third [electrostatic] field arranged to focus them to form in a second image plane a second electron image comprising electrons having energies within said selected range.

14. An electron energy spectrometer comprising in sequence:

(a) means for causing electrons to be emitted from said surface;

(b) a first [electrostatic] lens system arranged to project at least some of said electrons onto a first diffraction plane as a Fourier transform of an electron image of at least a part of said surface;

(c) a torroidal capacitor type electrostatic energy analyzer having an object plane and conjugate thereto a first image plane, said analyzer being disposed with said object plane coincident with said first diffraction plane and being arranged to project electrons of said Fourier transform as an energy dispsered Fourier transform in said first image plane; and (d) an electron detector means disposed for the detection of electrons in said energy dispersed Fourier transform.

*15. A spectrometer as claimed in claim 1 wherein said first and second lens systems are electrostatic lens systems.*

*16. A method as claimed in claim 13 wherein said first and third fields are electrostatic fields.*

*17. A spectrometer as claimed in claim 14 wherein said first lens system is an electrostatic lens system.*

* * * * *